United States Patent
Yamamoto

(10) Patent No.: US 10,953,630 B2
(45) Date of Patent: Mar. 23, 2021

(54) METHOD FOR MANUFACTURING CLAD MATERIAL

(71) Applicant: HITACHI METALS, LTD., Tokyo (JP)

(72) Inventor: Shinji Yamamoto, Suita (JP)

(73) Assignee: HITACHI METALS, LTD., Tokyo (JP)

( * ) Notice: Subject to any disclaimer, the term of this patent is extended or adjusted under 35 U.S.C. 154(b) by 304 days.

(21) Appl. No.: 16/155,904

(22) Filed: Oct. 10, 2018

(65) Prior Publication Data

US 2019/0047256 A1 Feb. 14, 2019

Related U.S. Application Data

(62) Division of application No. 15/925,876, filed on Mar. 20, 2018.

(30) Foreign Application Priority Data

Aug. 9, 2017 (JP) .............................. JP2017-154123

(51) Int. Cl.
*B23K 20/04* (2006.01)
*B32B 15/01* (2006.01)
(Continued)

(52) U.S. Cl.
CPC .............. *B32B 15/013* (2013.01); *B21B 3/00* (2013.01); *B23K 20/04* (2013.01); *B23K 20/227* (2013.01); *B32B 15/01* (2013.01); *B32B 15/015* (2013.01); *B32B 15/04* (2013.01); *B32B 15/043* (2013.01); *B32B 15/18* (2013.01); *B32B 15/20* (2013.01); *C21D 1/26* (2013.01); *C21D 1/32* (2013.01); *C22F 1/08* (2013.01); *H01L 23/36* (2013.01);
(Continued)

(58) Field of Classification Search
None
See application file for complete search history.

(56) References Cited

U.S. PATENT DOCUMENTS 2,125,153 A * 7/1938 Chace .................... B23K 20/04
148/532
3,381,364 A * 5/1968 Winter .................. B23K 20/04
228/172
(Continued)

FOREIGN PATENT DOCUMENTS

AT 352507 B 9/1979
CN 105658831 A 6/2016
(Continued)

OTHER PUBLICATIONS

Decision to Grant a Patent dated Oct. 3, 2017, Issued in counterpart Japanese Patent Application No. 2017-154123, w/English translation. (6 pages).
(Continued)

*Primary Examiner* — Devang R Patel
(74) *Attorney, Agent, or Firm* — Westerman, Hattori, Daniels & Adrian, LLP

(57) ABSTRACT

A clad material includes a first layer made of stainless steel and a second layer made of Cu or a Cu alloy and roll-bonded to the first layer. In the clad material, a grain size of the second layer measured by a comparison method of JIS H 0501 is 0.150 mm or less.

8 Claims, 5 Drawing Sheets

(51) Int. Cl.

| | |
|---|---|
| *H01M 10/6554* | (2014.01) |
| *B21B 3/00* | (2006.01) |
| *C21D 1/26* | (2006.01) |
| *C21D 1/32* | (2006.01) |
| *C22F 1/08* | (2006.01) |
| *H01L 23/36* | (2006.01) |
| *B32B 15/20* | (2006.01) |
| *B32B 15/04* | (2006.01) |
| *B32B 15/18* | (2006.01) |
| *B23K 20/227* | (2006.01) |
| *B23K 103/04* | (2006.01) |
| *B23K 103/12* | (2006.01) |
| *C22C 38/44* | (2006.01) |
| *B23K 103/16* | (2006.01) |
| *C22C 38/02* | (2006.01) |
| *C22C 38/04* | (2006.01) |
| *H01M 10/653* | (2014.01) |
| *B21B 1/38* | (2006.01) |

(52) U.S. Cl.
CPC ........... *H01M 10/6554* (2015.04); *B21B 1/38* (2013.01); *B21B 2001/386* (2013.01); *B21B 2003/005* (2013.01); *B23K 2103/05* (2018.08); *B23K 2103/12* (2018.08); *B23K 2103/166* (2018.08); *B32B 2311/12* (2013.01); *B32B 2311/30* (2013.01); *C21D 2251/02* (2013.01); *C22C 38/02* (2013.01); *C22C 38/04* (2013.01); *C22C 38/44* (2013.01); *H01M 10/653* (2015.04); *Y10T 428/12882* (2015.01); *Y10T 428/12903* (2015.01); *Y10T 428/12917* (2015.01); *Y10T 428/12924* (2015.01); *Y10T 428/12951* (2015.01); *Y10T 428/12958* (2015.01); *Y10T 428/12965* (2015.01); *Y10T 428/12972* (2015.01); *Y10T 428/12979* (2015.01); *Y10T 428/24942* (2015.01); *Y10T 428/249921* (2015.04); *Y10T 428/26* (2015.01); *Y10T 428/266* (2015.01)

(56) References Cited

U.S. PATENT DOCUMENTS

| | | | | |
|---|---|---|---|---|
| 3,462,828 A * | 8/1969 | Winter | ............... | B23K 20/04 228/172 |
| 3,589,874 A * | 6/1971 | Butt | .................. | B32B 15/015 428/675 |
| 3,607,439 A | 9/1971 | Lilley | | |
| 3,832,147 A * | 8/1974 | Forand | ............... | B23K 20/2275 428/653 |
| 4,362,262 A * | 12/1982 | Winter | ............... | B23K 20/04 228/117 |
| 4,467,954 A * | 8/1984 | Brenneman | ............ | B23K 20/04 228/117 |
| 4,818,634 A * | 4/1989 | Bliss | .................... | B32B 15/015 148/326 |
| 8,813,342 B2 * | 8/2014 | Bergstrom | ........... | B23K 20/227 29/514 |
| 2015/0159246 A1 | 6/2015 | Kishi et al. | | |
| 2015/0190985 A1 | 7/2015 | Oda et al. | | |

FOREIGN PATENT DOCUMENTS

| | | |
|---|---|---|
| EP | 3 037 567 A1 | 6/2016 |
| GB | 1139102 A | 1/1969 |
| GB | 1242325 A | 8/1971 |
| JP | 2005-134073 A | 5/2005 |
| JP | 2005-219478 A | 8/2005 |
| JP | 2008-123964 A | 5/2008 |
| JP | 2010-77743 A | 4/2010 |
| JP | 2012-87368 A | 5/2012 |
| JP | 2014-1449 A | 1/2014 |
| WO | 2014/010455 A1 | 1/2014 |

OTHER PUBLICATIONS

Final Office Action dated Sep. 12, 2019, issued in counterpart U.S. Appl. No. 15/925,876 (12 pages).
Office Action dated Jul. 20, 2018, issued in counterpart Korean Application No. 10-2018-0031265, with English translation. (7 pages).
Machine Translation, Sagawa et al., JP 2012-087368, May 2012 (Year: 2012) cited in U.S. Office Action dated Nov. 9, 2018, (17 pages).
Office Action dated May 21, 2019, issued in counterpart CN application No. 201810298300.0, with English translation. (15 pages).
Cordero, Z.C. et al., "Six Decades of the Hall-Petch Effect—a Survey of Grain-Size Strengthening Studies on Pure Metals," International Materials Reviews 61,8 (Jul. 2016): pp. 495-542; cited in U.S. Non-Final Office Action dated Jun. 6, 2019.
Non-Final Office Action dated Jun. 6, 2019, issued in U.S. Appl. No. 15/925,876. (9 pages).
Office Action dated Nov. 14, 2019, issued in counterpart CN Application No. 201810298300.0, with English translation (10 pages).
"Kupfer in der Elektrotechnik—Kabel und Leitungen", DKI Brochure, Deutsches Kupfer-Institut, Dusseldorf, Mar. 1, 2000, pp. 1-44, XP002539807; cited in Extended European Search Report dated Oct. 25, 2018.
Extended European Search Report dated Oct. 25, 2018, issued in counterpart European Application No. 18164968.2. (10 pages).
Final Office Action dated Feb. 8, 2019, issued in U.S. Appl. No. 15/925,376 (12 pages).
Office Action dated Aug. 31, 2020, issued in counterpart EP Application No. 18164968.2. (6 pages).

* cited by examiner

CROSS-SECTIONAL PHOTOGRAPH OF Cu LAYER (SECOND LAYER) IN ROLLING DIRECTION

EXAMPLE 1

50μm

EXAMPLE 2

50μm

COMPARATIVE EXAMPLE 2

50μm

COMPARATIVE EXAMPLE 3

50μm

METHOD FOR MANUFACTURING CLAD MATERIAL

CROSS-REFERENCE TO RELATED APPLICATION

This application is a divisional application of U.S. patent application Ser. No. 15/925,876 filed Mar. 20, 2018, and is based upon and claims the benefits of priority from Japanese Patent Application No. 2017-154123 filed on Aug. 9, 2017, the entire contents of which being incorporated herein by reference.

BACKGROUND OF THE INVENTION

Field of the Invention

The present invention relates to a clad material and a method for manufacturing the clad material, and more particularly, it relates to a clad material in which Cu or a Cu alloy and stainless steel are roll-bonded to each other and a method for manufacturing the clad material.

Description of the Background Art

A clad material in which stainless steel and Cu or a Cu alloy are roll-bonded to each other is known in general, as disclosed in Japanese Patent Laid-Open No. 2005-134073, for example.

Japanese Patent Laid-Open No. 2005-134073 discloses a stainless steel-copper clad formed by rolling or pressure-bonding (cladding) a skin material made of copper to both the front and back surfaces of a core material made of stainless steel.

Japanese Patent Laid-Open No. 2005-134073 does not describe in detail a specific rolling or pressure-bonding method for the stainless steel-copper clad. However, in general, the stainless steel-copper clad disclosed in Japanese Patent Laid-Open No. 2005-134073 is conceivably formed by rolling or pressure-bonding through diffusion annealing after stainless steel and copper are bonded to each other by cold rolling. As a result of various investigations, the inventor of the present invention has found that in a clad material in which stainless steel (a first layer) and copper (a second layer) are roll-bonded to each other by cold rolling and diffusion annealing, the workability of the clad material is disadvantageously reduced due to a reduction in the elongation of the clad material.

SUMMARY OF THE INVENTION

The present invention has been proposed in order to solve the aforementioned problem in a clad material in which Cu or a Cu alloy and stainless steel are roll-bonded to each other, and an object of the present invention is to provide a clad material capable of significantly reducing or preventing a reduction in workability by significantly reducing or preventing a reduction in elongation and a method for manufacturing the clad material.

As a result of earnest investigations to solve the aforementioned problem, the inventor of the present invention has found that the elongation of a clad material is reduced due to grain coarsening of a second layer made of Cu or a Cu alloy. Then, the present invention has been completed. That is, a clad material according to a first aspect of the present invention includes a first layer made of stainless steel and a second layer made of Cu or a Cu alloy and roll-bonded to the first layer, and a grain size of the second layer measured by a comparison method of JIS H 0501 is 0.150 mm or less. The term "stainless steel" denotes an alloy that contains 50 mass % or more of Fe (iron) as a main component and further contains at least 10.5 mass % or more of Cr (chromium). The term "Cu alloy" denotes an alloy that contains 50 mass % or more of Cu (copper) as a main component. In addition, JIS H 0501 corresponds to ISO 2624:1973.

In the clad material according to the first aspect of the present invention, as hereinabove described, the grain size of the second layer measured by the comparison method of JIS H 0501 is 0.150 mm or less. According to this configuration, the grain size does not exceed 0.150 mm such that the crystals of the Cu or Cu alloy of which the second layer is made are not excessively coarsened, and hence a reduction in the elongation of the clad material due to the second layer is significantly reduced or prevented. Consequently, a reduction in the workability of the clad material can be significantly reduced or prevented.

As hereinabove described, the clad material according to the first aspect includes the first layer made of stainless steel and the second layer made of Cu or a Cu alloy and roll-bonded to the first layer. Thus, in the clad material, its mechanical strength and the corrosion resistance of one surface of the second layer can be ensured by the first layer made of stainless steel, and its conductivity and thermal conductivity can be ensured by the second layer made of Cu or a Cu alloy. Consequently, the clad material suitable for a chassis that also serves as a conductive member for a battery or a heat sink, for example, can be provided.

In the aforementioned clad material according to the first aspect, the grain size of the second layer is 0.130 mm or less. According to this configuration, grain coarsening of the Cu or Cu alloy of which the second layer is made is further significantly reduced or prevented, and hence a reduction in the elongation of the clad material due to the second layer is further significantly reduced or prevented.

The aforementioned clad material according to the first aspect preferably further includes a third layer made of stainless steel and roll-bonded to a side of the second layer opposite to the first layer. According to this configuration, in the clad material, its mechanical strength and the corrosion resistance of both surfaces of the second layer can be reliably ensured by the first layer and the third layer both made of stainless steel, and its conductivity and thermal conductivity can be ensured by the second layer made of Cu or a Cu alloy. Furthermore, in a state where the second layer is sandwiched between the first layer and the third layer both made of stainless steel, rolling can be performed such that warpage in a rolling direction can be easily significantly reduced or prevented, and roll bonding can be stably performed.

In the aforementioned clad material according to the first aspect, the stainless steel is preferably austenitic stainless steel. According to this configuration, the austenitic stainless steel and the Cu or Cu alloy are both nonmagnetic, and hence it is possible to make the entire clad material nonmagnetic. Consequently, when the clad material is used for a chassis that also serves as a heat sink, for example, adverse influence on other components (electronic components, for example) due to magnetization of the chassis can be prevented.

A method for manufacturing a clad material according to a second aspect of the present invention includes softening annealing for softening a first metal plate made of stainless steel and softening a second metal plate made of Cu or a Cu alloy, clad rolling for rolling and bonding the first metal plate and the second metal plate, which have undergone the softening annealing, to each other in a state where the first metal plate and the second metal plate are stacked on each other so as to produce a pressure-bonded material, and diffusion annealing for performing a diffusion treatment on the pressure-bonded material. The clad material including a first layer made of stainless steel and a second layer made of Cu or a Cu alloy and roll-bonded to the first layer, in which a grain size of the second layer measured by a comparison method of JIS H 0501 is 0.150 mm or less, is produced by reducing a thickness of the second metal plate in the pressure-bonded material before the diffusion annealing to 20% or more of a thickness of the second metal plate after the softening annealing.

In the method for manufacturing a clad material according to the second aspect of the present invention, as hereinabove described, the thickness of the second metal plate in the pressure-bonded material before the diffusion annealing is reduced to 20% or more of the thickness of the second metal plate after the softening annealing. Thus, as compared with the case where the thickness of the second metal plate in the pressure-bonded material before the diffusion annealing is reduced to less than 20% of the thickness of the second metal plate after the softening annealing, internal stress (strain) accumulated in the second metal plate due to rolling after the softening annealing and before the diffusion annealing can conceivably be reduced, and the internal stress (strain) accumulated in the second metal plate can conceivably be evenly distributed. Consequently, uneven progress of recrystallization due to the magnitude of the internal stress (strain) and its distribution in the course of recovery, recrystallization, and grain growth at the time of the diffusion annealing can be significantly reduced or prevented, and excessive growth of the crystals (crystals of the Cu or Cu alloy) of the second metal plate can be significantly reduced or prevented. Thus, excessive growth of the crystals of the Cu or Cu alloy of which the second layer of the clad material is made can be significantly reduced or prevented. Therefore, in the clad material, the grain size of the second layer measured by the comparison method of JIS H 0501 can be reliably reduced to 0.150 mm or less, and hence a reduction in the elongation of the clad material due to the second layer can be significantly reduced or prevented. In other words, a reduction in the workability of the clad material can be significantly reduced or prevented.

In the aforementioned method for manufacturing a clad material according to the second aspect, the thickness of the second metal plate in the pressure-bonded material before the diffusion annealing is preferably reduced to 25% or more and 50% or less of the thickness of the second metal plate after the softening annealing. According to this configuration, the thickness of the second metal plate in the pressure-bonded material before the diffusion annealing is reduced to 25% or more of the thickness of the second metal plate after the softening annealing such that excessive growth of the crystals of the second metal plate at the time of the diffusion annealing can be reliably significantly reduced or prevented. Furthermore, the thickness of the second metal plate in the pressure-bonded material before the diffusion annealing is reduced to 50% or less of the thickness of the second metal plate after the softening annealing, and hence a pressure bonding load can be sufficiently applied to the first metal plate and the second metal plate such that the thickness of the pressure-bonded material is reduced at the time of the clad rolling. Thus, the first metal plate and the second metal plate can be sufficiently bonded to each other.

In the aforementioned method for manufacturing a clad material according to the second aspect, the diffusion annealing is preferably performed under a temperature condition of 850° C. or more and 1000° C. or less. Furthermore, the diffusion annealing is more preferably performed under a temperature condition of 900° C. or more and 1000° C. or less. According to this configuration, the diffusion annealing is performed under the temperature condition of 850° C. or more (preferably 900° C. or more) such that not only the second metal plate made of Cu or a Cu alloy but also the first metal plate made of stainless steel can be reliably annealed. Furthermore, the diffusion annealing is performed under the temperature condition of 1000° C. or less such that an excessive increase in the growth rate of the crystals of the second metal plate due to the excessively high temperature can be significantly reduced or prevented. Thus, excessive growth of the crystals of the second metal plate can be reliably significantly reduced or prevented.

In the aforementioned method for manufacturing a clad material according to the second aspect, temper rolling for hardening the second metal plate is preferably performed after the softening annealing and before the clad rolling such that the thickness of the second metal plate after the temper rolling is reduced to 60% or more and less than 100% of the thickness of the second metal plate after the softening annealing. Furthermore, the thickness of the second metal plate after the temper rolling is more preferably reduced to 80% or more and less than 100% of the thickness of the second metal plate after the softening annealing. According to this configuration, internal stress (strain) is accumulated in the second metal plate by the temper rolling such that the mechanical strength (such as 0.2% proof stress) of the second metal plate made of Cu or a Cu alloy can be improved. Consequently, the mechanical strength of the second metal plate, which is lower than that of the first metal plate made of stainless steel, can be moved closer to the mechanical strength of the first metal plate. Therefore, at the time of the clad rolling, the metal plates having close mechanical strength can be rolled and bonded to each other, and hence the first metal plate and the second metal plate can be reliably bonded to each other.

Furthermore, the thickness of the second metal plate after the temper rolling is reduced to 60% or more (preferably 80% or more) of the thickness of the second metal plate after the softening annealing. According to this configuration, the thickness of the second metal plate is not excessively reduced by the temper rolling, and hence the thickness of the second metal plate in the pressure-bonded material before the diffusion annealing can be maintained at 20% or more of the thickness of the second metal plate after the softening annealing, and the first metal plate and the second metal plate can be sufficiently bonded to each other at the time of the clad rolling after the temper rolling.

The aforementioned method for manufacturing a clad material according to the second aspect preferably further includes producing the clad material in which the grain size of the second layer is 0.130 mm or less. According to this configuration, grain coarsening of the Cu or Cu alloy of which the second layer (second metal plate) is made is further significantly reduced or prevented such that a reduction in the elongation of the clad material due to the second layer can be further significantly reduced or prevented.

The aforementioned method for manufacturing a clad material according to the second aspect preferably further includes producing the pressure-bonded material by softening a third metal plate made of stainless steel in the softening annealing, and rolling and bonding the first metal plate, the second metal plate, and the third metal plate, which have undergone the softening annealing, to each other in a state where the first metal plate, the second metal plate, and the third metal plate are stacked in this order in the clad rolling so as to produce the clad material including the first layer made of the stainless steel, the second layer made of the Cu or Cu alloy and roll-bonded to the first layer, and a third layer made of stainless steel and roll-bonded to a side of the second layer opposite to the first layer, in which the grain size of the second layer is 0.150 mm or less. According to this configuration, in the clad material, its mechanical strength and the corrosion resistance of both surfaces of the second layer can be reliably ensured by the first layer and the third layer both made of stainless steel, and its conductivity and thermal conductivity can be ensured by the second layer made of Cu or a Cu alloy. Furthermore, at the time of the clad rolling, rolling can be performed in a state where the second metal plate is sandwiched between the first metal plate and the third metal plate both made of stainless steel such that warpage in a rolling direction is easily significantly reduced or prevented, and roll bonding can be stably performed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described with reference to the drawings.
(Configuration of Portable Device)

First, the schematic configuration of a portable device 100 according to an embodiment (first embodiment) of the present invention is described with reference to FIGS. 1 and 2.

Figure 1:
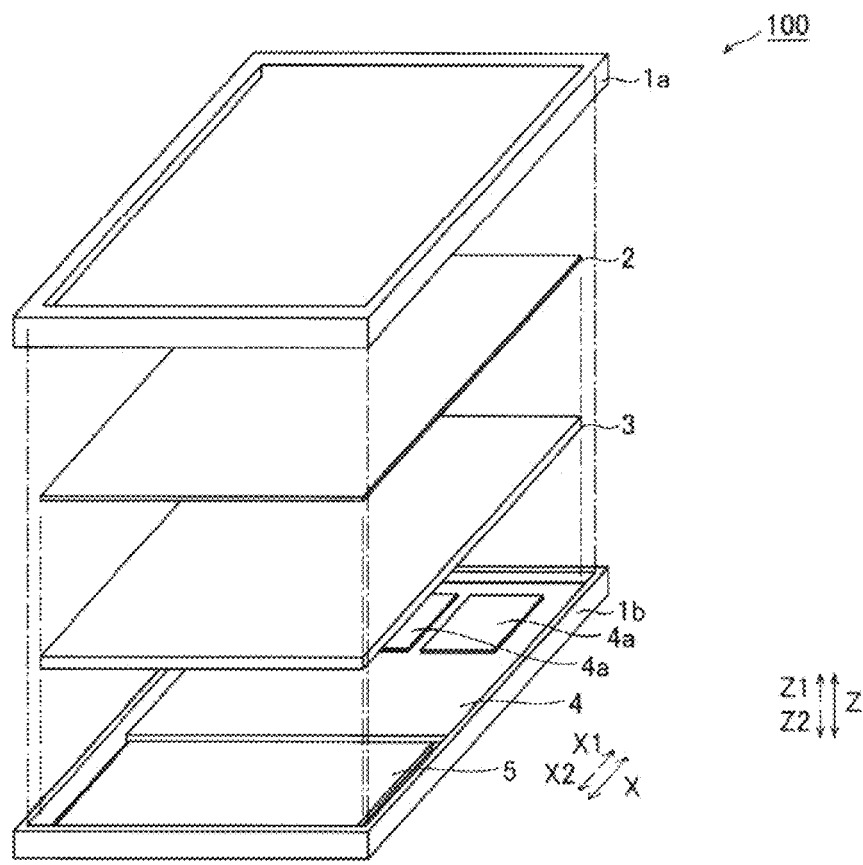
FIG. 1 is a schematic exploded perspective view of a portable device using a clad material according to an embodiment of the present invention as a chassis.

As shown in FIG. 1, the portable device 100 according to the present embodiment includes an upper housing 1a, a display 2, a chassis 3, a substrate 4, a battery 5, and a lower housing 1b. The display 2, the chassis 3, the substrate 4, and the battery 5 are disposed in the lower housing 1b in this order from the upper side (Z1 side). The lower housing 1b is covered with the upper housing 1a from above.

The display 2 includes a liquid crystal display, an organic EL display, or the like, and has a function of displaying an image on its upper surface on the Z1 side.

The chassis 3 has a function of ensuring the mechanical strength of the portable device 100 and a function of releasing heat from the display 2, the substrate 4 (electronic components 4a), and the battery 5 to the outside. That is, the chassis 3 also serves as a heat sink.

The substrate 4 is disposed on the X1 side of the lower housing 1b, and the battery 5 is disposed on the X2 side of the lower housing 1b. The electronic components 4a such as a CPU (Central Processing Unit) configured to drive an application are disposed on the upper surface of the substrate 4 on the Z1 side.
(Configuration of Chassis (Clad Material))

Figure 2:
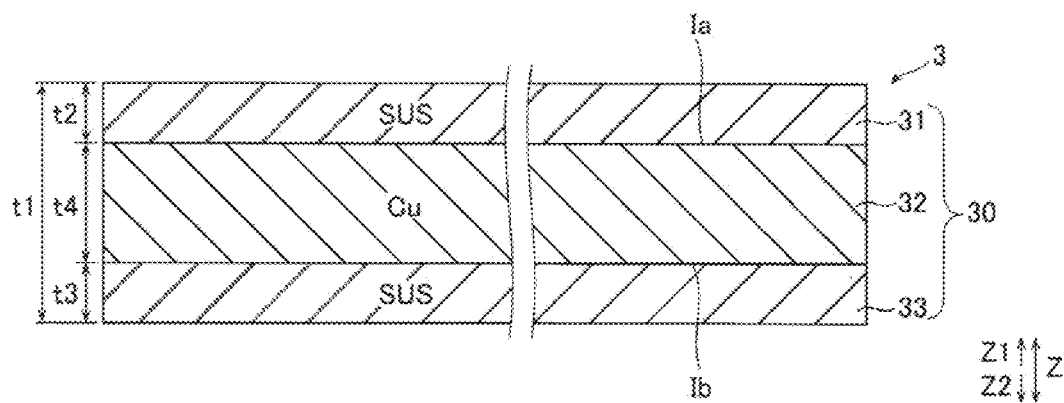
FIG. 2 is a cross-sectional view showing the structure of the clad material (chassis) according to the embodiment of the present invention.

As shown in FIG. 2, the chassis 3 is made of a clad material 30 having a three-layer structure in which an SUS layer 31 made of stainless steel, a Cu layer 32 made of Cu or a Cu alloy, and an SUS layer 33 made of stainless steel are stacked in this order. The Cu layer 32 is roll-bonded to the lower surface of the SUS layer 31 on a Z2 side, and is roll-bonded to the upper surface of the SUS layer 33 on the Z1 side. At an interface Ia between the SUS layer 31 and the Cu layer 32 and at an interface Ib between the Cu layer 32 and the SUS layer 33, the mutual layers are firmly bonded to each other by forming an interatomic bond by diffusion annealing. The SUS layer 31, the Cu layer 32, and the SUS layer 33 are examples of a "first layer", a "second layer", and a "third layer" in the claims, respectively.

The thickness t1 of the clad material 30 in a direction Z is not particularly restricted. According to the present embodiment, the thickness t1 of the chassis 3 is preferably 0.5 mm or less in order to significantly reduce or prevent an increase in the thickness in the direction Z in consideration of the weight reduction and compactification of the portable device 100. Furthermore, the thickness t1 of the chassis 3 is preferably 0.1 mm or more in order to ensure the mechanical strength of the chassis 3.

The ratio (t2:t4:t3) of the thickness t2 of the SUS layer 31, the thickness t4 of the Cu layer 32, and the thickness t3 of the SUS layer 33 in the clad material 30 is not particularly restricted. The thickness t2 of the SUS layer 31 and the thickness t3 of the SUS layer 33, both of which are made of stainless steel, are preferably substantially equal to each other so as to equalize the extent of elongation at the time of rolling on both sides in the direction Z.

According to the present embodiment, the thickness ratio is preferably varied according to the characteristics (thermal conductivity and mechanical strength) required in the chassis 3. When mechanical strength is particularly required in the chassis 3, for example, the thickness t2 of the SUS layer 31 and the thickness t3 of the SUS layer 33, both of which are made of stainless steel having high mechanical strength, are preferably increased. In order to reliably ensure the mechanical strength of the clad material 30, the thickness t4 of the Cu layer 32 is preferably 60% or less of the thickness t1 of the clad material 30. When thermal conductivity is particularly required in the chassis 3, on the other hand, the thickness t4 of the Cu layer 32 is preferably increased. In order to reliably ensure the thermal conductivity of the clad material 30, the thickness t4 of the Cu layer 32 is preferably 33% or more of the thickness t1 of the clad material 30. The aforementioned thicknesses t1 to t4 each are an average of a plurality of thicknesses measured at a plurality of places.

The elongation of the clad material 30 is preferably 8% or more, and more preferably 10% or more.

The stainless steel of which the SUS layer 31 and the SUS layer 33 are made is not particularly restricted as long as the same is stainless steel, such as austenitic stainless steel, ferritic stainless steel, and martensitic stainless steel. According to the present embodiment, it is not preferable for the chassis 3 to be magnetized in the portable device 100 including the electronic components 4a (see FIG. 1). Therefore, the stainless steel of which the SUS layer 31 and the SUS layer 33 are made is preferably austenitic stainless steel, and more preferably austenitic stainless steel of so-called SUS300 series (JIS standards).

Furthermore, the stainless steel of which the SUS layer 31 and the SUS layer 33 are made is particularly preferably SUS316L (JIS standards), which has a small C (carbon) content and is less likely to be magnetized, of austenitic stainless steel. The SUS316L is austenitic stainless steel obtained by reducing the content of C from SUS316 (JIS standards) that contains 18 mass % of Cr, 12 mass % of Ni, 2.5 mass % of Mo, inevitable impurities including C, and the balance iron. Although the SUS layer 31 and the SUS layer 33 are not restricted to the same composition, the same are preferably made of stainless steel having the same composition in consideration of rolling stability etc.

The Cu layer 32 is made of Cu of C1000 series (JIS standards) or a Cu alloy such as C2000 series (JIS standards). As the copper, there are so-called oxygen-free copper, phosphorus deoxidized copper, tough pitch copper, etc. As the Cu alloy, a Cu alloy, which contains 0.05 mass % or more and 0.15 mass % or less of Zr (zirconium), of C1510 (JIS standards), a Cu alloy that contains 4 ppm or more and 55 ppm or less of Ti (titanium), 2 ppm or more and 12 ppm or less of S (sulfur), and 2 ppm or more and 30 ppm or less of O (oxygen) in terms of mass ratio, etc. are preferable in order to significantly reduce or prevent grain coarsening. The above Cu alloy that contains Zr has appropriate thermal conductivity and conductivity, and can be expected to have an effect of improving the mechanical strength necessary for thinning. The above Cu alloy that contains a trace amount of Ti, etc. has appropriate thermal conductivity and conductivity, and can be expected to have a conductivity of 98% IACS or more. In addition, TiO, $TiO_2$, TiS, Ti—O—S, etc. exist in the form of a compound or agglomerate, and Ti, S, etc. exist in the form of a solid solution such that an effect of refining crystal grains of the Cu layer 32 can be expected. The copper of which the Cu layer 32 is made generally has higher thermal conductivity and greater ductility than the stainless steel of which the SUS layer 31 and the SUS layer 33 are made.

According to the present embodiment, the grain size of the Cu layer 32 (Cu or a Cu alloy) is 0.150 mm or less. Thus, grain coarsening of the Cu or Cu alloy of which the Cu layer 32 is made is significantly reduced or prevented such that a reduction in the elongation (ductility) of the Cu layer 32 is significantly reduced or prevented. Consequently, a reduction in workability at the time of processing the clad material 30 into the chassis 3 is significantly reduced or prevented. The grain size of the Cu layer 32 is preferably 0.130 mm or less. The grain size of the Cu layer 32 is more preferably 0.120 mm or less, and still more preferably 0.110 mm or less. For the purpose of significantly reducing or preventing a reduction in the elongation (ductility) of the clad material 30, the smaller the grain size of the Cu layer 32 is, the more preferable it is. From this point of view, it is conceivably unimportant to provide the lower limit critical value (lower limit) of the grain size of the Cu layer 32, but as a management level, for example, the lower limit of the grain size of the Cu layer 32 may be 0.050 mm, for example.

In the present invention, the grain size of the Cu layer 32 is measured by a comparison method of JIS H 0501. Specifically, the clad material 30 is cut, and the cut cross-sectional surface is polished, for example, to expose the structure of the Cu layer 32. Then, a cross-sectional photograph of the exposed structure of the Cu layer 32 is acquired using a microscope. Thereafter, a standard photograph of attached drawings of JIS H 0501 best corresponding to the acquired cross-sectional photograph is determined by comparison, and the grain size of the Cu layer 32 in an observation area of a predetermined size (2 mm×2 mm, for example) in the acquired cross-sectional photograph is converted into an actual grain size such that the grain size of the Cu layer 32 is acquired. The cross-sectional photograph of the structure of the Cu layer 32 is obtained from a cross-sectional surface (a cross-sectional surface in a rolling direction) obtained by cutting the clad material 30 in parallel to the rolling direction. Furthermore, it is preferable to select a plurality of observation areas that do not overlap each other and acquire the grain size of the Cu layer 32 in each of the observation areas.

When the grain size of the Cu layer 32 is 0.150 mm or less, a pattern that appears due to the coarsened crystal grains of the Cu layer 32 hardly occurs on the exposed surfaces of the SUS layers 31 and 33 of the clad material 30. Thus, the appearance of the clad material 30 can be improved.

(Outline of Method for Manufacturing Chassis (Clad Material))

Next, a method for manufacturing the clad material 30, of which the chassis 3 is made, according to the embodiment of the present invention is described with reference to FIGS. 2 to 5.

Figure 3:
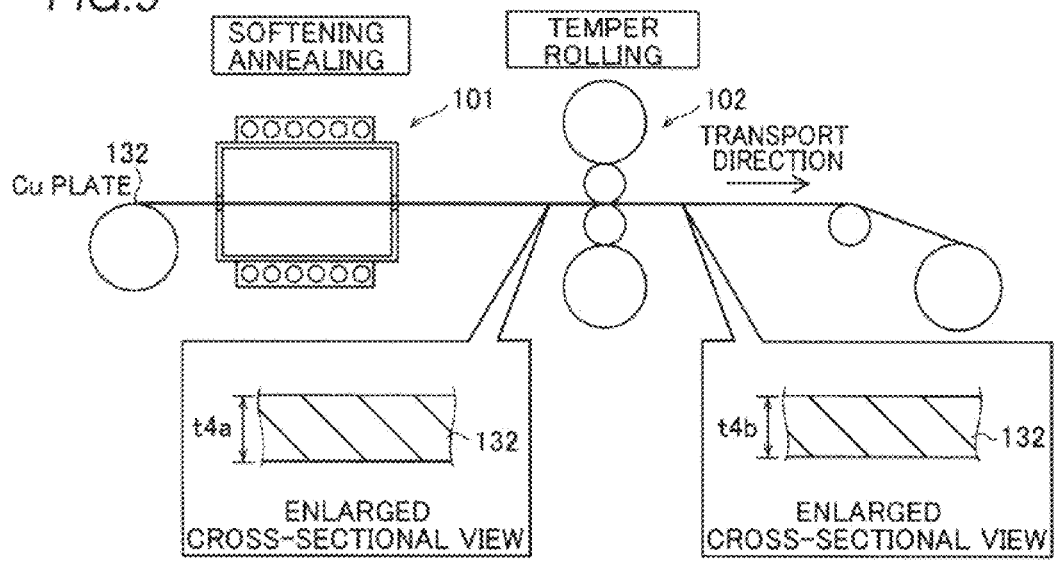
FIG. 3 is a schematic view for illustrating a manufacturing process of the clad material according to the embodiment of the present invention.

First, as shown in FIG. 3, a strip-like Cu plate 132 made of Cu or a Cu alloy is prepared. Then, softening annealing is performed on the Cu plate 132 using an annealing furnace 101, the inside of which is set to a temperature that exceeds the recrystallization temperature (220° C., for example) of the Cu or Cu alloy of which the Cu plate 132 is made. Thus, internal strain due to work-hardening is removed from the Cu plate 132, and the structure of the Cu plate 132 is sufficiently softened. The Cu plate 132 is an example of a "second metal plate" in the claims.

Then, the Cu plate 132 that has undergone softening annealing undergoes temper rolling using a roller 102. By the temper rolling, the thickness of the Cu plate 132 is reduced from t4a to t4b, and internal stress (strain) is accumulated to work-harden the Cu plate 132. The thickness t4a and the thickness t4b each are an average of a plurality of thicknesses of the Cu plate 132 measured at a plurality of places. Furthermore, the number of passes for temper rolling can be appropriately selected.

Figure 4:
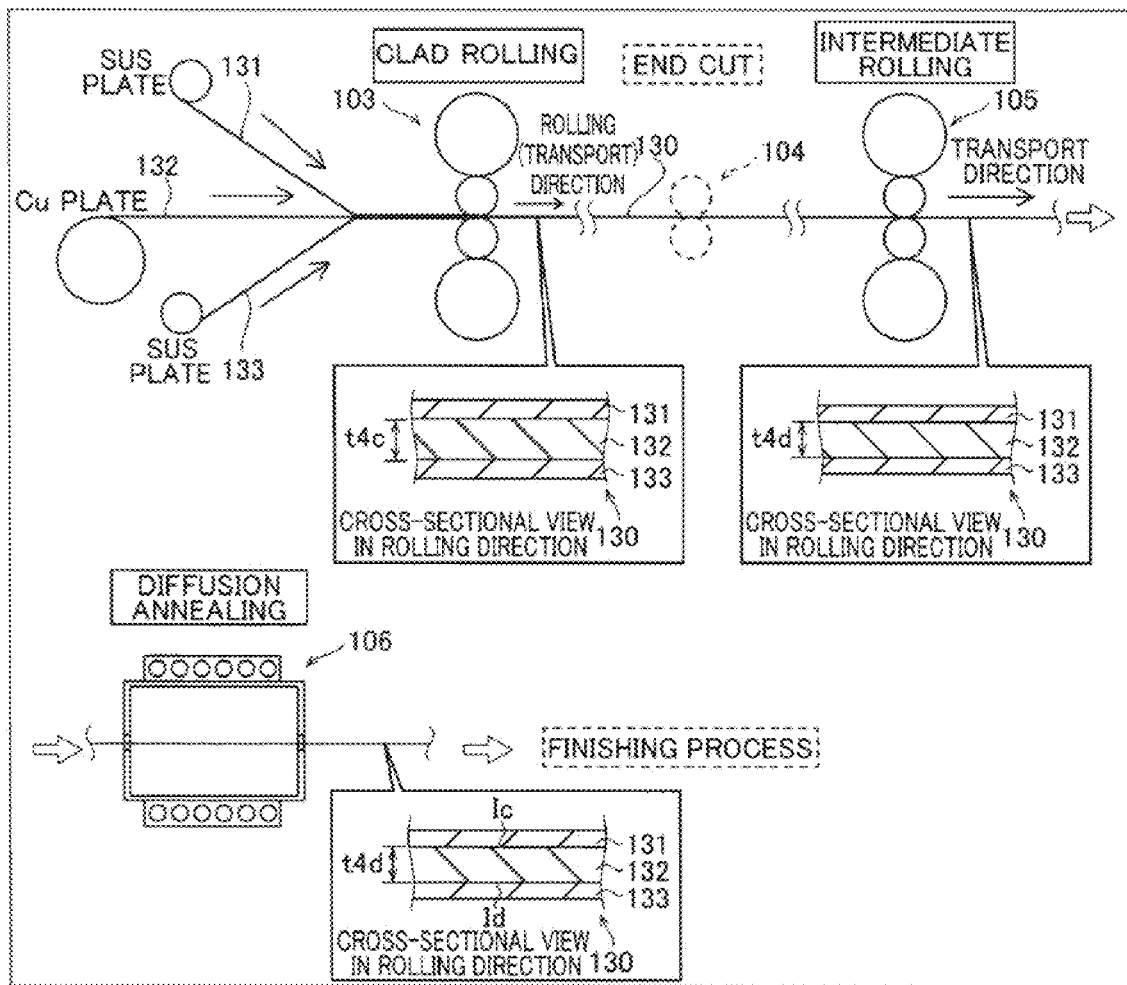
FIG. 4 is a schematic view for illustrating the manufacturing process of the clad material according to the embodiment of the present invention.
Figure 5:
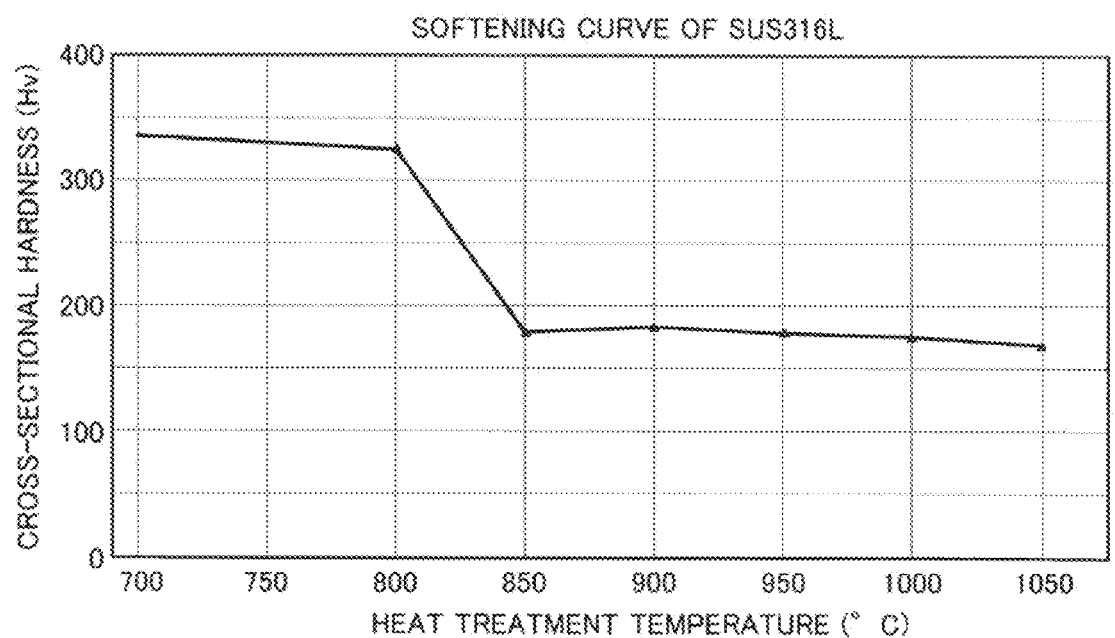
FIG. 5 is the softening curve of SUS316L.

As shown in FIG. 4, in addition to the strip-like Cu plate 132 that has undergone temper rolling, a strip-like SUS plate 131 and a strip-like SUS plate 133 made of stainless steel are prepared. Both the SUS plates 131 and 133 are sufficiently annealed. The thickness of the SUS plate 131, the thickness of the Cu plate 132 that has undergone temper rolling, and the thickness of the SUS plate 133 are appropriately selected according to the thickness ratio (t2:t4:t3) of the SUS layer 31, the Cu layer 32, and the SUS layer 33 in the clad material 30 to be produced. The SUS plate 131 and the SUS plate 133 are examples of a "first metal plate" and a "third metal plate" in the claims, respectively.

Then, in a state where the SUS plate 131, the Cu plate 132 that has undergone temper rolling, and the SUS plate 133 are stacked in this order, clad rolling, in which rolling and bonding are performed using a roller 103, is performed. At this time, the longitudinal direction of the strip-like SUS plate 131, Cu plate 132, and SUS plate 133 is the rolling direction. Thus, a pressure-bonded material 130 in which the SUS plate 131, the Cu plate 132, and the SUS plate 133 are bonded (roll-bonded) to each other in a state where the same are stacked in this order is produced. By the clad rolling, the thickness of the Cu plate 132 is reduced from t4b (see FIG. 3) to t4c, and internal stress (strain) is accumulated to work-harden the Cu plate 132. The thickness t4c is an average of a plurality of thicknesses of the Cu plate 132 measured at a plurality of places. Furthermore, the number of passes for clad rolling can be appropriately selected.

Thereafter, if necessary, the length of the pressure-bonded material 130 in a width direction may be adjusted by cutting an end of the pressure-bonded material 130 in the width direction using an end cutting machine 104. Then, the pressure-bonded material 130 undergoes intermediate rolling using a roller 105 such that the thickness of the pressure-bonded material 130 is adjusted. Thus, variations in thickness between pressure-bonded materials 130 (clad materials 30) can be reduced. Also by the intermediate rolling, the thickness of the Cu plate 132 is reduced from t4c to t4d, and internal stress (strain) is accumulated to work-harden the Cu plate 132. The thickness t4d is an average of a plurality of thicknesses of the Cu plate 132 measured at a plurality of places. Furthermore, the number of passes for intermediate rolling can be appropriately selected.

Then, diffusion annealing is performed using an annealing furnace 106, the inside of which is set to a temperature that exceeds the recrystallization temperature of the stainless steel of which the SUS plate 131 is made. Thus, the structures of all the SUS plate 131, the Cu plate 132, and the SUS plate 131 are softened according to the material. At an interface Ic between the SUS plate 131 and the Cu plate 132 and at an interface Id between the Cu plate 132 and the SUS plate 133, the mutual layers are firmly bonded to each other by forming an interatomic bond by a diffusion treatment. Consequently, the clad material 30 including the SUS layer 31 shown in FIG. 2, the Cu layer 32 roll-bonded to the SUS layer 31, and the SUS layer 33 roll-bonded to the side of the Cu layer 32 opposite to the SUS layer 31 is produced.

Thereafter, a finishing process including finish rolling, shape correction, slit cutting, press working, etc. is appropriately performed on the clad material 30 as necessary. Consequently, the chassis 3 made of the clad material 30, as shown in FIG. 2, is produced. According to the present embodiment, as shown in FIG. 4, the process at least from the clad rolling to the slit cutting in the finishing process is continuously performed, and hence the tact time of the clad material 30 can be effectively reduced. Incidentally, the manufacturing method according to the present invention is not restricted to a configuration in which the process from the clad rolling to the slit cutting in the finishing process is continuously performed.

(Specific Rolling Conditions in Present Embodiment)

In the manufacturing method according to the present embodiment, the thickness t4d (see FIG. 4) of the Cu plate 132 before the diffusion annealing (after the intermediate rolling) is reduced to 20% or more of the thickness t4a (see FIG. 3) of the Cu plate 132 after the softening annealing (before the temper rolling). That is, the rolling reduction in each of the temper rolling, the clad rolling, and the intermediate rolling is set such that the thickness t4d is 20% or more of the thickness t4a. In other words, the rolling reduction in each of the temper rolling, the clad rolling, and the intermediate rolling is set such that the total rolling reduction ((t4a-t4d)/t4a×100(%)) in the temper rolling, the clad rolling, and the intermediate rolling is 80% or less. If the thickness t4d is 20% or more of the thickness t4a, the rolling reduction in each of the temper rolling, the clad rolling, and the intermediate rolling can be appropriately changed. The thickness t4d may be any percentage of the thickness t4a so far as the same is 20% or more of the thickness t4a. However, as a difference between the thickness t4d and the thickness t4a increases, the rolling efficiency of the clad material 30 increases, and hence from the practical viewpoint, the thickness t4d is preferably 25% or more and 50% or less of the thickness t4a.

(Specific Rolling Conditions in Temper Rolling)

The SUS plate 131 and the SUS plate 133 made of stainless steel have high mechanical strength and low ductility, and the Cu plate 132 made of Cu or a Cu alloy has low mechanical strength and high ductility. Thus, before the clad rolling, it is preferable to move the ductility of the SUS plate 131 and the SUS plate 133 closer to that of the Cu plate 132. Thus, it is possible to significantly reduce or prevent non-uniformity between the thicknesses of the SUS plates 131 and 133 in the rolling direction during the clad rolling, and the sufficiently pressure-bonded material 130 can be easily produced. Therefore, it is preferable to use the SUS plates 131 and 133 each having a softened structure and reduced mechanical strength as compared with the case where no annealing is performed, and it is preferable to use the Cu plate 132 having a work-hardened structure and increased mechanical strength as compared with the case where annealing is performed. Therefore, it is preferable to work-harden the structure of the Cu plate 132 by reducing the thickness of the Cu plate 132 to some extent by the temper rolling. On the other hand, it is necessary to perform the clad rolling and the intermediate rolling after the temper rolling, and hence it is not preferable to perform excessive rolling in the temper rolling from the viewpoint of significantly reducing or preventing grain coarsening of the Cu layer 32 of the clad material 30.

Therefore, in order to increase the mechanical strength while significantly reducing or preventing influence on grain coarsening of the Cu layer 32 of the clad material 30, it is preferable to perform the temper rolling such that the thickness t4b of the Cu plate 132 after the temper rolling is 60% or more and less than 100% of the thickness t4a of the Cu plate 132 before the temper rolling. In other words, the rolling reduction ((t4a−t4b)/t4a×100(%)) in the temper rolling is preferably more than 0% and 40% or less. From the viewpoint of significantly reducing or preventing grain coarsening of the Cu layer 32 of the clad material 30, the thickness t4b is preferably 70% or more of the thickness t4a, and more preferably 80% or more of the thickness t4a. Furthermore, from the viewpoint of increasing the mechanical strength of the Cu plate 132, the thickness t4b is more preferably 90% or less of the thickness t4a.

(Specific Rolling Conditions in Clad Rolling)

In the clad rolling, when the rolling reduction is too small, there is a possibility that the SUS plate 131, the Cu plate 132, and the SUS plate 133 are not sufficiently bonded to each other. Therefore, in order for the clad material 30 to obtain sufficient bonding strength while significantly reducing or preventing influence on grain coarsening of the Cu layer 32 of the clad material 30, it is preferable to perform the clad rolling such that the thickness t4c of the Cu plate 132 after the clad rolling is 35% or more and 50% or less of the thickness t4b of the Cu plate 132 before the clad rolling. In other words, the rolling reduction ((t4b-t4c)/t4b×100(%)) in the clad rolling is preferably 50% or more and 65% or less. From the viewpoint of significantly reducing or preventing grain coarsening of the Cu layer 32 of the clad material 30, the thickness t4c is preferably 40% or more of the thickness t4b. From the viewpoint that the clad material 30 obtains sufficient bonding strength, the thickness t4c is more preferably 40% or less of the thickness t4b.

Furthermore, in the clad rolling, in order to sufficiently bond the SUS plate 131, the Cu plate 132, and the SUS plate 133 to each other, a load (pressure bonding load) applied to the SUS plate 131, the Cu plate 132, and the SUS plate 133 by the roller 103 is preferably 4.4 kN/mm or more. Thus, the thicknesses of the SUS plate 131, the Cu plate 132, and the SUS plate 133 after the clad rolling are easily equalized.

(Specific Rolling Conditions in Intermediate Rolling)

In the intermediate rolling, the rolling reduction is appropriately set such that the thickness can be adjusted while influence on grain coarsening of the Cu layer 32 of the clad material 30 is significantly reduced or prevented. That is, in the intermediate rolling, the rolling reduction is appropriately set such that the Cu plate 132 that has undergone the temper rolling and the clad rolling ultimately has a thickness t4d that satisfies a predetermined range (t4d≥t4a×0.2).

(Diffusion Annealing)

The diffusion annealing is performed on the pressure-bonded material 130 under a temperature condition of 850° C. or more and 1000° C. or less. For example, in the softening curve of SUS316L shown as an example in FIG. 5, as compared with the case of the temperature condition of 750° C., the cross-sectional hardness of SUS316L hardly decreases when the temperature condition is 800° C., but the cross-sectional hardness of SUS316L sufficiently decreases when the temperature condition is 850° C. Therefore, the diffusion annealing is performed on the pressure-bonded material 130 under a temperature condition of 850° C. or more such that the structures of the SUS plate 131 and the SUS plate 133 both made of stainless steel and the structure of the Cu plate 132 made of Cu or a Cu alloy having a recrystallization temperature lower than that of the stainless steel are conceivably sufficiently softened. In addition, under the temperature condition of 850° C., the softening rate of the SUS plates 131 and 133 is small, it takes time to sufficiently soften the structures and appropriately diffuse the elements, and the tact time is conceivably increased. Therefore, from the viewpoint of reducing the tact time, it is preferable to perform diffusion annealing under a temperature condition of 900° C. or more. A similar softening curve is conceivably obtained even for stainless steel other than SUS316L, and hence it is conceivably preferable to perform diffusion annealing under a temperature condition of 850° C. or more and 1000° C. or less even on stainless steel other than SUS316L.

By the manufacturing method described above, the clad material 30 in which the grain size of the Cu layer 32 is 0.150 mm or less (preferably 0.130 mm or less) is manufactured.

Effects of Present Embodiment

According to the present embodiment (first embodiment), the following effects can be obtained.

According to the present embodiment, as hereinabove described, in the clad material 30, the grain size of the Cu layer 32 measured by the comparison method of JIS H 0501 is 0.150 mm or less. According to this configuration, the grain size does not exceed 0.150 mm such that the crystals of the Cu or Cu alloy of which the Cu layer 32 is made are not excessively coarsened, and hence a reduction in the elongation of the clad material 30 due to the Cu layer 32 is significantly reduced or prevented. Consequently, a reduction in the workability of the clad material 30 can be significantly reduced or prevented.

According to the present embodiment, the clad material 30 includes the SUS layer 31 made of stainless steel and the Cu layer 32 made of Cu or a Cu alloy and roll-bonded to the SUS layer 31. Thus, in the clad material 30, its mechanical strength and the corrosion resistance of one surface (the surface on the Z1 side) of the Cu layer 32 can be ensured by the SUS layer 31 made of stainless steel, and its conductivity and thermal conductivity can be ensured by the Cu layer 32 made of Cu or a Cu alloy. Consequently, the clad material 30 suitable for the chassis 3 that also serves as a heat sink, for example, can be provided.

According to the present embodiment, the grain size of the Cu layer 32 is preferably 0.130 mm or less. According to this configuration, grain coarsening of the Cu or Cu alloy of which the Cu layer 32 is made is further significantly reduced or prevented, and hence a reduction in the elongation of the clad material 30 due to the Cu layer 32 is further significantly reduced or prevented.

According to the present embodiment, the clad material 30 includes the SUS layer 33 made of stainless steel and roll-bonded to the side of the Cu layer 32 opposite to the SUS layer 31. Thus, in the clad material 30, its mechanical strength and the corrosion resistance of both surfaces of the Cu layer 32 can be reliably ensured by the SUS layer 31 and the SUS layer 33, and its conductivity and thermal conductivity can be ensured by the Cu layer 32. Furthermore, in a state where the Cu layer 32 made of Cu or a Cu alloy is sandwiched between the SUS layer 31 and the SUS layer 33 both made of stainless steel, rolling can be performed such that warpage in the rolling direction can be easily significantly reduced or prevented, and roll bonding can be stably performed.

According to the present embodiment, the stainless steel is preferably austenitic stainless steel. According to this configuration, the austenitic stainless steel and the Cu or Cu alloy are both nonmagnetic, and hence it is possible to make the entire clad material 30 nonmagnetic. Consequently, when the clad material 30 is used for the chassis 3 that also serves as a heat sink, adverse influence on the substrate 4 (electronic components 4a) due to magnetization of the chassis 3 can be prevented.

In the manufacturing method according to the present embodiment, the thickness t4d of the Cu plate 132 in the pressure-bonded material 130 before the diffusion annealing is reduced to 20% or more of the thickness t4a of the Cu plate 132 after the softening annealing. Thus, as compared with the case where the thickness t4d of the Cu plate 132 in the pressure-bonded material 130 before the diffusion annealing is reduced to less than 20% of the thickness t4a of the Cu plate 132 after the softening annealing, internal stress (strain) accumulated in the Cu plate 132 due to rolling after the softening annealing and before the diffusion annealing can conceivably be reduced, and the internal stress (strain) accumulated in the Cu plate 132 can conceivably be evenly distributed. Consequently, uneven progress of recrystallization due to the magnitude of the internal stress (strain) and its distribution in the course of recovery, recrystallization, and grain growth at the time of the diffusion annealing can be significantly reduced or prevented, and excessive growth of the crystals (crystals of the Cu or Cu alloy) of the Cu plate 132 can be significantly reduced or prevented. Thus, excessive growth of the crystals of the Cu or Cu alloy of which the Cu layer 32 of the clad material 30 is made can be significantly reduced or prevented. Therefore, in the clad material 30, the grain size of the Cu layer 32 measured by the comparison method of JIS H 0501 can be reliably reduced to 0.150 mm or less. Consequently, a reduction in the elongation of the clad material 30 due to the Cu layer 32 can be significantly reduced or prevented, and hence the clad material 30 has an elongation of 8% or more, more preferably 10% or more (the elongation in Example 1 described below is 13.5%). In other words, a reduction in the workability of the clad material 30 can be significantly reduced or prevented.

In the manufacturing method according to the present embodiment, the thickness t4d of the Cu plate 132 in the pressure-bonded material 130 before the diffusion annealing is preferably reduced to 25% or more and 50% or less of the thickness t4a of the Cu plate 132 after the softening annealing. According to this configuration, the thickness t4d of the Cu plate 132 in the pressure-bonded material 130 before the diffusion annealing is reduced to 25% or more of the thickness t4a of the Cu plate 132 after the softening annealing such that excessive growth of the crystals of the Cu plate 132 at the time of the diffusion annealing can be reliably significantly reduced or prevented. Furthermore, the thickness t4d of the Cu plate 132 in the pressure-bonded material 130 before the diffusion annealing is reduced to 50% or less of the thickness t4a of the Cu plate 132 after the softening annealing, and hence a pressure bonding load can be sufficiently applied to the SUS plate 131 and the Cu plate 132 such that the thickness of the pressure-bonded material 130 is reduced at the time of the clad rolling. Thus, the SUS plate 131 and the Cu plate 132 can be sufficiently bonded to each other.

In the manufacturing method according to the present embodiment, the diffusion annealing is performed under the temperature condition of 850° C. or more and 1000° C. or less (preferably under the temperature condition of 900° C. or more and 1000° C. or less). Thus, the diffusion annealing is performed under the temperature condition of 850° C. or more (preferably 900° C. or more) such that not only the Cu plate 132 made of Cu or a Cu alloy but also the SUS plates 131 and 133 made of stainless steel can be reliably annealed. Furthermore, the diffusion annealing is performed under the temperature condition of 1000° C. or less such that an excessive increase in the growth rate of the crystals of the Cu plate 132 due to the excessively high temperature can be significantly reduced or prevented. Thus, excessive growth of the crystals of the Cu plate 132 can be reliably significantly reduced or prevented.

In the manufacturing method according to the present embodiment, the temper rolling for hardening the Cu plate 132 is performed after the softening annealing and before the clad rolling such that the thickness of the Cu plate 132 after the temper rolling is reduced to 60% or more (preferably 80% or more) and less than 100% of the thickness of the Cu plate 132 after the softening annealing. Thus, internal stress (strain) is accumulated in the Cu plate 132 by the temper rolling such that the mechanical strength (such as 0.2% proof stress) of the Cu plate 132 made of Cu or a Cu alloy can be improved. Consequently, the mechanical strength of the Cu plate 132, which is lower than that of the SUS plates 131 and 133 made of stainless steel, can be moved closer to the mechanical strength of the SUS plates 131 and 133. Therefore, at the time of the clad rolling, the metal plates having close mechanical strength can be rolled and bonded to each other, and hence the SUS plates 131 and 133 and the Cu plate 132 can be reliably bonded to each other.

Furthermore, the thickness of the Cu plate 132 after the temper rolling is reduced to 60% or more (preferably 80% or more) of the thickness of the Cu plate 132 after the softening annealing. Thus, the thickness of the Cu plate 132 is not excessively reduced by the temper rolling, and hence the thickness of the Cu plate 132 in the pressure-bonded material before the diffusion annealing can be maintained at 20% or more of the thickness of the Cu plate 132 after the softening annealing, and the SUS plates 131 and 133 and the Cu plate 132 can be sufficiently bonded to each other at the time of the clad rolling after the temper rolling.

In the manufacturing method according to the present embodiment, the clad material 30 in which the grain size of the Cu layer 32 is 0.130 mm or less is preferably produced. According to this configuration, grain coarsening of the Cu or Cu alloy of which the Cu layer 32 (Cu plate 132) is made is further significantly reduced or prevented such that a reduction in the elongation of the clad material 30 due to the Cu layer 32 can be further significantly reduced or prevented.

In the manufacturing method according to the present embodiment, the pressure-bonded material 130 is produced by softening the SUS plates 131 and 133 made of stainless steel in the softening annealing, and rolling and bonding the SUS plate 131, the Cu plate 132, and the SUS plate 133, which have undergone the softening annealing, to each other in a state where the SUS plate 131, the Cu plate 132, and the SUS plate 133 are stacked in this order in the clad rolling. Thus, in the clad material 30, its mechanical strength and the corrosion resistance of both surfaces of the Cu layer 32 can be reliably ensured by the SUS layer 31 and the SUS layer 33, and its conductivity and thermal conductivity can be ensured by the Cu layer 32. Furthermore, at the time of the clad rolling, rolling can be performed in a state where the Cu plate 132 made of Cu or a Cu alloy is sandwiched between the SUS plates 131 and 133 made of stainless steel such that warpage in the rolling direction is easily significantly reduced or prevented, and roll bonding can be stably performed.

Examples

Next, measurements of the workability, mechanical strength, and magnetic characteristics performed to confirm the effect of the present invention are described with reference to FIGS. 2 to 4, 6, and 7.

In order to measure the workability, mechanical strength, and magnetic characteristics, first, the clad material 30 according to the aforementioned embodiment (first embodiment) shown in FIG. 2 was produced by the manufacturing method shown in FIGS. 3 and 4. Specifically, first, a Cu plate 132 made of oxygen-free copper (C1020, JIS standards) and having a thickness t4a of 0.5 mm was prepared. Then, softening annealing was performed on the Cu plate 132 at a temperature exceeding the recrystallization temperature of the copper of which the Cu plate 132 was made, and thereafter temper rolling was performed. Thus, the thickness t4b of the Cu plate 132 after the temper rolling was reduced to 0.4 mm (80% of the thickness t4a), and the Cu plate 132 was work-hardened. In other words, the temper rolling was performed at a rolling reduction of 20%. The hardness due to the work-hardening is determined according to the relationship between the thicknesses (t4a, t4b) of the Cu plate 132 before and after the temper rolling. Furthermore, the hardness of the Cu plate 132 due to the temper rolling may be adjusted to ½H or ¼H, for example.

In addition, SUS plates 131 and 133 each made of SUS316L (JIS standards) and having a thickness of 0.2 mm were prepared. The SUS plates 131 and 133 sufficiently softened by annealing were used.

Then, clad rolling was performed in a state where the SUS plate 131, the work-hardened Cu plate 132, and the SUS plate 133 were stacked in this order. At this time, the pressure bonding load was set to a value of 4.4 kN/mm or more. Thus, the pressure-bonded material 130 in which the SUS plate 131, the Cu plate 132, and the SUS plate 133 were bonded (roll-bonded) to each other in a state where the SUS plate 131, the Cu plate 132, and the SUS plate 133 were stacked in this order was produced. In the clad rolling, the thickness t4c of the Cu plate 132 after the clad rolling was reduced to 0.175 mm (44% of the thickness t4b). In other words, the clad rolling was performed at a rolling reduction of 56%.

Thereafter, intermediate rolling was performed on the pressure-bonded material 130. In the intermediate rolling, the thickness t4d of the Cu plate 132 after the intermediate rolling was reduced to 0.117 mm (67% of the thickness t4c). In other words, the intermediate rolling was performed at a rolling reduction of 33%.

Then, a clad material 30 of Example 1 was produced by performing diffusion annealing at 950° C. for a predetermined time on the pressure-bonded material 130 after the intermediate rolling. In Example 1, the rolling reduction in each of the temper rolling, the clad rolling, and the intermediate rolling was set such that the thickness t4d (=0.117 mm) of the Cu plate 132 after the intermediate rolling (before the diffusion annealing) was 23% (=0.117/0.5×100 (%)) of the thickness t4a (=0.5 mm) of the Cu plate 132 before temper rolling (after softening and annealing). Thus, the clad material 30 having a thickness of 0.234 mm was produced from the Cu plate 132 with a thickness of 0.4 mm after the temper rolling and the SUS plates 131 and 133 with a thickness of 0.2 mm after the softening annealing through the clad rolling, the intermediate rolling, and the diffusion annealing.

Next, a clad material of Example 2 was produced. Specifically, a Cu plate made of oxygen-free copper and having a thickness of 0.4 mm was prepared. Then, after softening annealing was performed on the Cu plate, clad rolling, intermediate rolling, and diffusion annealing (950° C.) were performed under the same conditions as in Example 1 described above without performing temper rolling such that the clad material of Example 2 was produced. In Example 2, the thickness (=0.117 mm) of the Cu plate before the diffusion annealing was reduced to 29% (=0.117/0.4×100 (%)) of the thickness (=0.4 mm) of the Cu plate after the softening annealing.

Furthermore, a clad material of Comparative Example 1 was produced. Specifically, a Cu plate made of oxygen-free copper and having a thickness of 2.1 mm was prepared. Then, after softening annealing was performed on the Cu plate, temper rolling was performed to set the thickness of the Cu plate after the temper rolling to 0.4 mm (19% of the thickness before the temper rolling). In other words, the temper rolling was performed at a rolling reduction of 81%. Then, clad rolling and intermediate rolling were performed under the same conditions as in Example 1 described above. Thereafter, diffusion annealing was performed at 1050° C. for a predetermined time on a pressure-bonded material after the intermediate rolling to produce the clad material of Comparative Example 1. In Comparative Example 1, the thickness (=0.117 mm) of the Cu plate before the diffusion annealing was reduced to 6% (=0.117/2.1×100(%)) of the thickness (=2.1 mm) of the Cu plate after the softening annealing.

Furthermore, a clad material of Comparative Example 2 was produced. Specifically, as in Comparative Example 1, a Cu plate made of oxygen-free copper and having a thickness of 2.1 mm was prepared. Then, after softening annealing was performed on the Cu plate, temper rolling was performed to set the thickness of the Cu plate after the temper rolling to 0.4 mm (19% of the thickness before the temper rolling). Then, clad rolling, intermediate rolling, and diffusion annealing (950° C.) were performed under the same conditions as in Example 1 described above such that the clad material of Comparative Example 2 was produced. Also in Comparative Example 2, the thickness of the Cu plate before the diffusion annealing was reduced to 6% of the thickness of the Cu plate after the softening annealing.

Furthermore, a clad material of Comparative Example 3 was produced. Specifically, a Cu plate made of oxygen-free copper and having a thickness of 0.8 mm was prepared. Then, after softening annealing was performed on the Cu plate, temper rolling was performed to set the thickness of the Cu plate after the temper rolling to 0.4 mm (50% of the thickness before the temper rolling). In other words, the temper rolling was performed at a rolling reduction of 50%. Then, clad rolling, intermediate rolling, and diffusion annealing (950° C.) were performed under the same conditions as in Example 1 described above such that the clad material of Comparative Example 3 was produced. In Comparative Example 3, the thickness (=0.117 mm) of the Cu plate before the diffusion annealing was reduced to 15% (=0.117/0.8×100(%)) of the thickness (=0.8 mm) of the Cu plate after the softening annealing.

Figure 6:
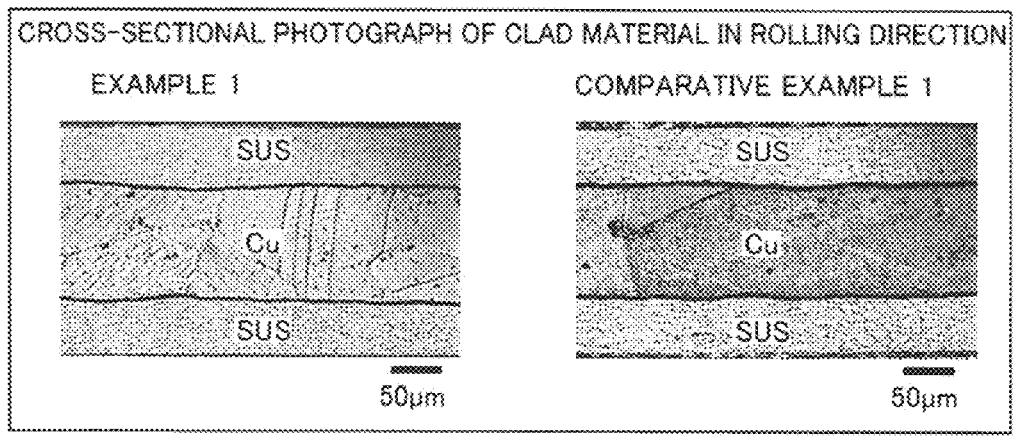
FIG. 6 is a cross-sectional photograph used for grain size measurement conducted to confirm the effect of the present invention.
Figure 7:
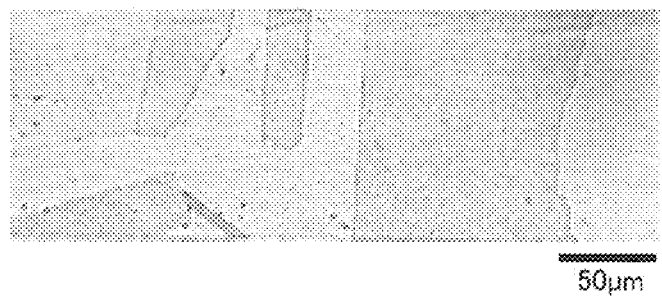
FIG. 7 is a cross-sectional photograph of a Cu layer used for grain size measurement conducted to confirm the effect of the present invention.
Figure 7:
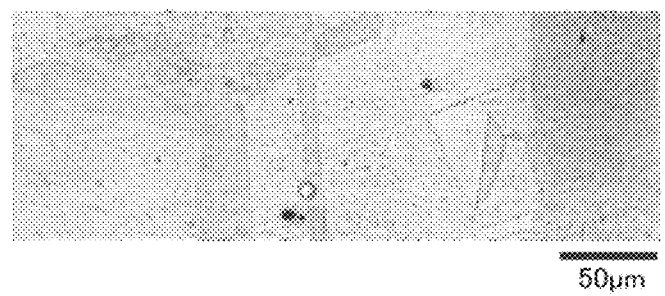
Figure 7:
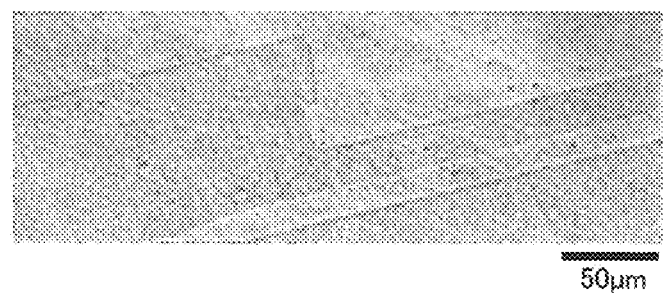
Figure 7:
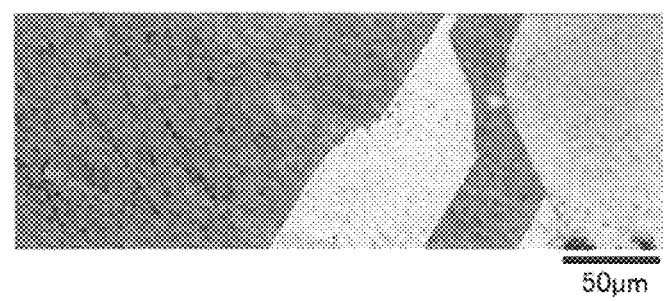

Thereafter, the grain size of the Cu layer of each of the produced clad materials of Examples 1 and 2 and Comparative Examples 1 to 3 was measured based on the comparison method of JIS H 0501, as described above. Note that the cross sections of the Cu layers of the plurality of produced clad materials, on which the grain size was measured, were cross-sections (cross-sections in the rolling direction) obtained by cutting the clad materials in parallel to the rolling direction. A specimen having a length of 15 mm in the rolling direction was taken from one clad material of each of Examples 1 and 2 and Comparative Examples 1 to 3, and the cross-section in the rolling direction was observed in the field magnified 100 times. The observation area of the cross-section of the Cu layer in one specimen was a 2 mm×2 mm (square) area not including SUS layers, and five areas that do not overlap each other were arbitrarily selected. Then, the grain sizes of the aforementioned five areas were measured by the comparison method, and the average value thereof was determined as the grain size of the Cu layer of the clad material. Cross-sectional photographs of the clad materials of Examples 1 and 2 and Comparative Examples 1 to 3 are shown in FIGS. 6 and 7, and the grain sizes of the respective Cu layers are shown in Table 1.

TABLE 1

| | THICKNESS OF Cu PLATE BEFORE DIFFUSION ANNEALING / THICKNESS OF Cu PLATE AFTER SOFTENING ANNEALING × 100(%) | DIFFUSION ANNEALING TEMPERATURE (° C.) | GRAIN SIZE (mm) |
|---|---|---|---|
| EXAMPLE 1 | 23 | 950 | 0.076~0.150 |
| EXAMPLE 2 | 29 | 950 | 0.076~0.127 |
| COMPARATIVE EXAMPLE 1 | 6 | 1050 | >0.250 |
| COMPARATIVE EXAMPLE 2 | 6 | 950 | >0.200 |
| COMPARATIVE EXAMPLE 3 | 15 | 950 | 0.127~0.200 |

As measurement results of the grain sizes of the respective Cu layers, in Examples 1 and 2 in which the thickness of the Cu plate before the diffusion annealing was 20% or more of the thickness of the Cu plate after the softening annealing, the grain size of the Cu layer was 0.076 mm to 0.150 mm (corresponding to about 2.5 to 4.5 according to the grain size numbers of the ASTM standards), which was not more than 0.150 mm (corresponding to 2.5 or higher according to the grain size numbers of the ASTM standards), in any of the plurality of clad materials. On the other hand, in Comparative Examples 1 and 2 in which the thickness of the Cu plate before the diffusion annealing was 6% (20% or less) of the thickness of the Cu plate after the softening annealing, the grain size of the Cu layer was increased beyond 0.200 mm in any of the plurality of clad materials. In Comparative Example 3 in which the thickness of the Cu plate before the diffusion annealing was 15% (20% or less) of the thickness of the Cu plate after the softening annealing, the grain size of the Cu layer was increased beyond 0.150 mm in some of the plurality of clad materials. Thus, it has been confirmable that the thickness of the Cu plate before the diffusion annealing is reduced to 20% or more of the thickness of the Cu plate after the softening annealing such that the grain size of the Cu layer can be reliably reduced to 0.150 mm or less.

In both Example 1 in which the temper rolling was performed and Example 2 in which no temper rolling was performed, the grain size of the Cu layer was 0.150 mm or less. From this fact, a manufacturing method of Example 1 in which the ductility of stainless steel and the ductility of Cu are moved closer to each other by the temper rolling such that bonding can be stably performed by the clad rolling is conceivably superior as a manufacturing method to a manufacturing method of Example 2 in which the ductility of stainless steel and the ductility of Cu are not moved closer to each other by no temper rolling.

In Comparative Examples 1 and 2 in which temperatures at the time of the diffusion annealing were different from each other, the grain size of the Cu layer in Comparative Example 2 in which the temperature at the time of the diffusion annealing was 950° C. lower than the temperature (1050° C.) in Comparative Example 1 was smaller than that in Comparative Example 1. However, in Comparative Example 2, the grain size of the Cu layer still remained beyond 0.150 mm. Consequently, the grain size of the Cu layer is conceivably more influenced by the rate of change of the thickness of the Cu plate before the diffusion annealing with respect to the thickness of the Cu plate after the softening annealing than the temperature at the time of the diffusion annealing.

Furthermore, a tensile strength test was performed on the clad material of Example 1 and the clad material of Comparative Example 1 based on JIS Z 2241 such that the tensile strength (force at break) and 0.2% proof stress (force when the elongation is 0.2%) as mechanical strength and the elongation as workability ((length at break–length before the test)/length before the test×100(%)) were measured. In addition, as magnetic characteristics, the relative magnetic permeability of each of the clad materials of Example 1 and Comparative Example 1 was measured. The results of these measurements are shown in Table 2.

TABLE 2

| | WORKABILITY | | MECHANICAL STRENGTH | | MAGNETIC CHARACTERISTICS |
|---|---|---|---|---|---|
| | GRAIN SIZE (mm) | ELONGATION (%) | TENSILE STRENGTH (MPa) | 0.2% PROOF STRESS (MPa) | RELATIVE MAGNETIC PERMEABILITY |
| EXAMPLE 1 | 0.108 | 13.5 | 568 | 551 | 1.003 |
| COMPARATIVE EXAMPLE 1 | >0.250 | 5.3 | 560 | 546 | 1.003 |

As for the workability, in Example 1 in which the grain size of the Cu layer was 0.150 mm or less (0.108 mm), the elongation of the clad material was 13.5% exceeding 8%, which was a preferable value, and 10%, which was considered as a more preferable value. That is, it has been confirmable that the clad material of Example 1 has sufficient workability (ease of deformation). On the other hand, in Comparative Example 1 in which the grain size of the Cu layer exceeded 0.250 mm, the elongation of the clad material was 5.3% not reaching 8%, which was a preferable value. That is, it has been confirmable that the clad material of Comparative Example 1 does not have sufficient workability. Consequently, it has been confirmed that the grain size of the Cu layer is set to 0.150 mm or less such that sufficient workability can be imparted to the clad material.

As for the mechanical strength, it has been confirmable that neither the tensile strength nor 0.2% proof stress is greatly different between Example 1 and Comparative Example 1, the mechanical strength is satisfactory, and it can be used for a structure such as a chassis. In addition, it has been confirmable that the relative magnetic permeability as magnetic characteristics is not greatly different between Example 1 and Comparative Example 1, it is at a level that hardly promotes magnetization, and it can be prevented from adversely influencing other components (electronic components, for example) due to magnetization.

The embodiment and Examples (any of these is the first embodiment) disclosed this time must be considered as illustrative in all points and not restrictive. The range of the present invention is shown not by the above description of the embodiment and Examples but by the scope of claims for patent, and all modifications within the meaning and range equivalent to the scope of claims for patent are further included.

Figure 8:
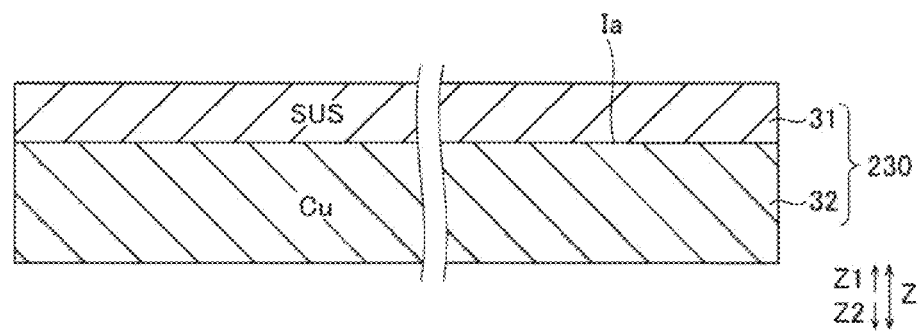
FIG. 8 is a cross-sectional view showing a clad material according to another embodiment of the present invention, the structure of which is different from the structure shown in FIG. 2.

For example, while the clad material is the clad material 30 having a three-layer structure in which the SUS layer 31 (first layer) made of stainless steel, the Cu layer 32 (second layer) made of Cu or a Cu alloy, and the SUS layer 33 (third layer) made of stainless steel are stacked in this order in the first embodiment, the present invention is not restricted to this. According to the present invention, as in another embodiment (second embodiment) shown in FIG. 8, which is different from the first embodiment, for example, the clad material may alternatively be a clad material 230 having a two-layer structure including a SUS layer 31 made of stainless steel and a Cu layer 32 made of Cu or a Cu alloy and pressure-bonded to the SUS layer 31. Alternatively, the clad material may have a four- or more-layer structure as long as the clad material includes a first layer made of stainless steel and a second layer made of Cu or a Cu alloy and pressure-bonded to the first layer.

While in order to produce the clad material 30, the temper rolling, the clad rolling, and the intermediate rolling are performed after the softening annealing and before the diffusion annealing in the first embodiment, the present invention is not restricted to this. According to the present invention, in order to produce the clad material, at least the clad rolling may alternatively be performed after the softening annealing and before the diffusion annealing. In order to easily and reliably perform the clad rolling, it is preferable to perform the temper rolling. Furthermore, in order to reduce a difference in the thickness of the clad material from product to product, it is preferable to perform the intermediate rolling.

While the clad material 30 is used as the chassis 3 of the portable device 100 in the first embodiment, the present invention is not restricted to this. According to the present invention, the clad material may alternatively be used for applications other than the chassis of the portable device. For example, the clad material according to the present invention may be used as a conductive member of a battery. The clad material according to the present invention is suitable for use when it is necessary to satisfy any one or both of mechanical strength and corrosion resistance and any one or both of conductivity and thermal conductivity.

What is claimed is:

1. A method for manufacturing a clad material, comprising:

softening annealing for softening a first metal plate made of stainless steel and softening a second metal plate made of Cu or a Cu alloy;

temper rolling and hardening the second metal plate after the softening annealing;

clad rolling for rolling and bonding the first metal plate, which has undergone the softening annealing and the second metal plate, which has undergone the temper rolling and hardening, to each other in a state where the first metal plate and the second metal plate are stacked on each other so as to produce a pressure-bonded material; and diffusion annealing for performing a diffusion treatment on the pressure-bonded material, wherein the clad material including a first layer made of stainless steel and a second layer made of Cu or a Cu alloy and roll-bonded to the first layer, in which a grain size of the second layer measured by a comparison method of JIS H 0501 is 0.150 mm or less, is produced by reducing a thickness of the second metal plate in the pressure-bonded material before the diffusion annealing to 20% or more of a thickness of the second metal plate after the softening annealing.

2. The method for manufacturing a clad material according to claim 1, wherein
   the thickness of the second metal plate in the pressure-bonded material before the diffusion annealing is reduced to 25% or more and 50% or less of the thickness of the second metal plate after the softening annealing.

3. The method for manufacturing a clad material according to claim 1, wherein
   the diffusion annealing is performed under a temperature condition of 850° C. or more and 1000° C. or less.

4. The method for manufacturing a clad material according to claim 3, wherein
   the diffusion annealing is performed under a temperature condition of 900° C. or more and 1000° C. or less.

5. The method for manufacturing a dad material according to claim 1, wherein
   the temper rolling and hardening the second metal plate is performed such that the thickness of the second metal plate after the temper rolling is reduced to 60% or more and less than 100% of the thickness of the second metal plate after the softening annealing.

6. The method for manufacturing a clad material according to claim 5, wherein
   the thickness of the second metal plate after the temper rolling is reduced to 80% or more and less than 100% of the thickness of the second metal plate after the softening annealing.

7. The method for manufacturing a clad material according to claim 1, further comprising producing the clad material in which the grain size of the second layer is 0.130 mm or less.

8. The method for manufacturing a clad material according to claim 1, further comprising producing the pressure-bonded material by softening a third metal plate made of stainless steel in the softening annealing, and rolling and bonding the first metal plate, the second metal plate, and the third metal plate, which have undergone the softening annealing, to each other in a state where the first metal plate, the second metal plate, and the third metal plate are stacked in this order in the clad rolling so as to produce the clad material including the first layer made of the stainless steel, the second layer made of the Cu or Cu alloy and roll-bonded to the first layer, and a third layer made of stainless steel and roll-bonded to a side of the second layer opposite to the first layer, in which the grain size of the second layer is 0.150 mm or less.

* * * * *